(12) United States Patent
Hashizume et al.

(10) Patent No.: US 7,872,257 B2
(45) Date of Patent: Jan. 18, 2011

(54) ORGANIC THIN FILM TRANSISTOR ARRAY AND METHOD OF MANUFACTURING THE SAME

(75) Inventors: Tomihiro Hashizume, Hatoyama (JP); Yuji Suwa, Kokubunji (JP); Masaaki Fujimori, Kodaira (JP); Tadashi Arai, Kumagaya (JP); Takeo Shiba, Kodaira (JP)

(73) Assignee: Hitachi, Ltd., Tokyo (JP)

( * ) Notice: Subject to any disclaimer, the term of this patent is extended or adjusted under 35 U.S.C. 154(b) by 37 days.

(21) Appl. No.: 12/128,993

(22) Filed: May 29, 2008

(65) Prior Publication Data

US 2008/0315191 A1 Dec. 25, 2008

(30) Foreign Application Priority Data

Jun. 19, 2007 (JP) ............................. 2007-160862

(51) Int. Cl.
*H01L 51/30* (2006.01)
*H01L 21/70* (2006.01)

(52) U.S. Cl. ........................ 257/40; 257/92; 257/410; 257/E51.006; 257/E51.007; 257/E21.535; 438/99; 438/82; 438/199; 438/216

(58) Field of Classification Search ............... 257/40, 257/92, 94, 60, 91, 410, E51.006, E51.007, 257/E21.535; 438/99, 82, 216, 199
See application file for complete search history.

(56) References Cited

U.S. PATENT DOCUMENTS

| 7,002,176 B2 | 2/2006 | Iechi et al. |
| 7,019,327 B2 | 3/2006 | Lee et al. |
| 2004/0012018 A1 | 1/2004 | Tanabe |
| 2006/0255335 A1 | 11/2006 | Nishikawa et al. |

| 2008/0012009 A1 | 1/2008 | Hashizume et al. |

FOREIGN PATENT DOCUMENTS

| JP | 2004-055654 | 2/2004 |
| JP | 2004-128028 | 4/2004 |
| JP | 2004-211091 | 7/2004 |

(Continued)

OTHER PUBLICATIONS

V. Sundar, et al., "Elastomeric Transistor Stamps: Reversible Probing of Charge Transport in Organic Crystals", Science, vol. 303, p. 1644 (Mar. 2004).

(Continued)

*Primary Examiner*—Victor A Mandala
*Assistant Examiner*—Whitney Moore
(74) *Attorney, Agent, or Firm*—Antonelli, Terry, Stout & Kraus, LLP.

(57) ABSTRACT

An n-type TFT and a p-type TFT are realized by selectively changing only a cover coat without changing a TFT material using an equation for applying the magnitude of a difference in the Fermi energy between an interface of semiconductor and an electrode and between an interface of semiconductor and insulator. At this time, in order to configure a predetermined circuit, the process is performed, as a source electrode and a drain electrode of the p-type TFT and a source electrode and a drain electrode of the n-type TFT being connected all, respectively, and an unnecessary interconnection is cut by irradiating light using a scanning laser exposure apparatus or the like.

8 Claims, 7 Drawing Sheets

FOREIGN PATENT DOCUMENTS

| | | |
|---|---|---|
| JP | 2006-278638 | 10/2006 |
| JP | 2006-278639 | 10/2006 |
| JP | 2008-021814 | 1/2008 |

OTHER PUBLICATIONS

O. Jurchescu, et al., "Effect of Impurities on the Mobility of Single crystal Pentacene", Applied Physics Letters, vol. 84, p. 3061 (Feb. 2004).

A. Brown, et al., Precursor Route Pentacene Metal-insulator-semiconductor Field-effect Transistors:, Journal of Applied Physics, vol. 79, p. 2136 (Feb. 1996).

A. Afzali, et al., "High-Performance, Solution-Processed Organic Thin Film Transistors from a Novel Pentacene Precursor", Journal of American Chemical Society, vol. 124, p. 8812 (Apr. 2002).

T. Minakata, et al., "Direct Formation of Pentacene Thin Films by Solution Process", Synthetic Metals, vol. 153, p. 1 (2005).

M. Nagano, et al., "The First Observation of $^1$H-NMR Spectrum of Pentacene", Japanese Journal of Applied Physics, vol. 43, p. L315 (Feb. 2004).

T. Yasuda, et al., "Status and Prospect of Organic Semiconductor for Organic Transistor", OYO Buturi, vol. 74, No. 9, 1196 (2005), with English Translation.

S. Kobayashi, et al., "Control of Carrier Density by Self-Assembled Monolayers in Organic Field-Effect Transistors", Nature Materials, vol. 3, pp. 317-322, (May 2004).

R. Tung, "Chemical Bonding and Fermi Level Pinning at Metal-Semiconductor Interfaces", Physical Review Letters, 84, (26), p. 6080 (Feb. 2000).

ORGANIC THIN FILM TRANSISTOR ARRAY AND METHOD OF MANUFACTURING THE SAME

INCORPORATION BY REFERENCE

The present application claims priority from Japanese application JP 2007-160862 filed on Jun. 19, 2007, the content of which is hereby incorporated by reference into this application.

BACKGROUND OF THE INVENTION

The present invention relates to an organic thin film transistor array and a method of manufacturing the same, and more particularly to an organic complementary thin film transistor (organic CTFT) and a method of manufacturing the same, and more particularly, a desired predetermined circuit configuration using an organic thin film transistor.

In a thin film display device using liquid crystal or an organic electroluminescence (EL) device, a device for driving a pixel, a thin film transistor (TFT) that uses amorphous silicon or polycrystalline silicon for a channel, is used. In a current state, the TFT using amorphous silicon or polycrystalline silicon is unlikely to have plasticity. In addition, since a vacuum apparatus is used in a manufacturing process, manufacturing cost is generally increased. Accordingly, in these display devices, in order to realize a flexible display device or reduce the manufacturing cost, researches on the formation of TFTs used in a driving circuit using an organic material have been widely made. In the organic thin film transistor (organic TFT), a semiconductor layer configuring a channel can be formed by a simple process such as a printing method, a spray method or an inkjet method. Thus, the organic TFT can be manufactured with significantly low cost compared with the TFT using inorganic semiconductor. In addition, since a large-area light weight thin film display device or integrated circuit can be easily manufactured, the organic TFT is expected to be applied to liquid crystal displays, organic EL displays or an IC cards.

In order to realize the flexible display device, it is necessary to provide flexibility including a peripheral circuit which drives the pixels. The carrier mobility of about 10 $cm^2/V \cdot s$ or more is required for the TFT used in the circuit which drives the pixel, and the organic TFT that only uses the low-molecular-weight organic molecules for the channel has proved to satisfy the above requirement. For example, in Science, Vol. 303, page 1644 (2004), the carrier mobility of 15 ($cm^2/V \cdot s$) is obtained in the organic TFT that uses single crystal of rubrene molecules for the channel. Also, in Applied Physics Letters, Vol. 84, page 3061 (2004), there has been reported the carrier mobility of 35 ($cm^2/V \cdot s$) at a room temperature for the single crystal of pentacene molecules which have been highly purified. However, in an organic TFT performance of which can be easily improved is composed of low-molecular-weight molecules, it is common to use vacuum deposition in the manufacturing thereof and the method is disadvantageous in view of the manufacture. Meanwhile, an organic TFT which can easily suppress manufacturing cost is composed of high-molecular-weight molecules, but it has a significantly low performance and thus is restrictively used.

As means for solving the above problem, there is a method of dissolving the low-molecular-weight molecules in a solvent and coating the solution to form a semiconductor layer of the channel. As to pentacene that is the most typical organic molecules as an applied example of the low-molecular-weight molecules to the TFT, for example, Journal of Applied Physics, Vol. 79, page 2136 (1996), and Journal of American Chemical Society, Vol. 124, page 8812 (2002) have reported a technique by which derivatives of pentacene molecules are synthesized, and a thin film is formed by using a solution in which the solubility with respect to the solvent is increased. Also, Synthetic Metals, Vol. 153, page 1 (2005) discloses a technique by which the pentacene molecules are directly solved in the solvent, and coated to form a thin film. In addition, Applied Physics letters, Vol. 84, page 3061 (2004) and Japanese Journal of Applied Physics, Vol. 43, page L315 (2004) disclose a procedure of solving pentacene molecules in the organic solvent.

In order to cheaply manufacture the organic TFT by coating, it is preferable that an electrode and an interconnection using a metal line as well as the organic semiconductor are prepared by coating. There is a method of coating fine particles of metal with an organic material so as to have the solubility with respect to the solvent, distributing metal ink or paste in which the fine particles are dissolved at predetermined places, performing a process at a predetermined temperature so as to eliminate the organic material, and forming the interconnection or electrode of metal. Currently, a method of forming an interconnection by printing silver or gold paste is established.

Meanwhile, in a field effect transistor (FET) using silicon, a complementary MOS (CMOS) device arranging two types of FETs in which a carrier for conducting a channel is an electron (n-type channel MOS) and a hole (p-type channel MOS) in series so as to reduce power consumption becomes an indispensable requirement of integration.

However, up to now, most of the organic TFTs are only operated as a p-type FET. The several causes thereof have been suggested, but are in controversy. For example, OYO BUTURI, Vol. 74, No. 9, 1196 (2005) discloses an example of an n-type channel and p-type channel organic TFTs, but the n-type and p-type TFTs are realized using separate organic semiconductor and an economically advantageous process is not disclosed. The principle configuring the n-type and p-type TFTs is not disclosed.

JP-A-2004-55654 discloses an organic semiconductor device in which source and drain electrodes are formed of materials having different work functions. For example, as the material of the source electrode used in the p-type organic semiconductor device, a material having a largest work function (metal such as gold, platinum, palladium, chrome, selenium, nickel, indium-tin-oxide (ITO), iridium zinc oxide (IZO), zinc oxide or an alloy thereof, tin oxide, copper iodide or the like) is preferably used. As the material of the drain electrode, metal or a compound having a work function smaller than that of the source electrode (metal such as silver, lead, tin, aluminum, calcium, indium, alkali metal such as lithium, alkaline earth metal such as magnesium or an alloy thereof, or an alkali metal compound, an alkaline earth metal compound or the like) is suitable. However, when the organic semiconductor material is in contact with the electrode material, charge exchange or charge screening occurs in the interface between the electrode and the organic semiconductor and thus the n-type/p-type is not determined only by the work functions of the electrodes.

JP-A-2004-211091 discloses organic semiconductor high-molecular-weight molecules for an organic thin film transistor, which represent both the p-type property and the n-type property by introducing a unit having a p-type semiconductor property (for example, a thiophene unit) and a unit having an n-type semiconductor property (for example, a thiazole ring) into a main chain, represent low off current using the same, and represent the both properties. However, although the property of the bulk can be defined, the electron structure of the semiconductor in the interface between the electrode and the organic semiconductor used in the FET and the interface between the insulator and the organic semiconductor cannot be determined. Thus, the property of the organic TFT is not defined.

JP-A-128028 discloses an organic FET using metal oxides having high conductivity by generating oxygen holes or interstitial metal in the lattices by deviating from stoichiometry ratios, (tin oxide, titanium oxide, germanium oxide, copper oxide, silver oxide, indium oxide, thallium oxide, barium titanate, strontium titanate, lanthanum chromate, tungsten oxide, europium oxide, aluminum oxide, or lead chromate), metal oxides having highest conductivity at their stoichiometry ratios (rhenium oxide, titanium oxide, lanthanum titanate, lanthanum nickel acid, lanthanum copper oxide, ruthenium copper oxide, strontium iridium acid, strontium chromate, lithium titanate, iridium oxide, or molybdenum oxide), conductive metal oxide (vanadium oxide, chrome oxide, iron calcium oxide, iron strontium oxide, strontium cobalt acid, strontium vanadium acid, strontium ruthenium acid, lanthanum cobalt acid, or nickel oxide), conductive metal oxide bronze (tungsten bronze (MxW03), MxM03, MxRe03 in which hydrogen atoms, alkali metal, alkaline earth metal or earth metal are included at a site where atoms are not present at the A position of the perovskite structure of tungsten oxide, molybdenum oxide, or rhenium oxide), as a semiconductor layer. In this case, the above metal oxide is only used as the semiconductor material and is not used as the electrode.

Meanwhile, in Physical Review Letters, 84, (26), page 6080 (2000), it is discussed that at the interface between the electrode and inorganic semiconductor, a method of deriving a vacuum level shift $\Delta$ from the physical constants of elements configuring the semiconductor and the electrode. If the vacuum level shift $\Delta$ is used, a Schottky barrier $\Phi$ for injection of carriers (electrons and holes) at the interface of the electrode and the inorganic semiconductor can be calculated and thus carrier injection velocity (the number of charges injected per 1 second) can be computed using an appropriate carrier injection mechanism such as the thermionic excitation model. That is, if the carrier is the electron, the Schottky barrier $\Phi$ is obtained by Equation 1.

$$\Phi = \Phi_M - \chi_S + \Delta \quad \text{Equation 1}$$

Here, the vacuum level shift $\Delta$ is assumed to be a positive sign when the Schottky barrier $\Phi$ is increased in the case the electron is injected from the electrode to the semiconductor, $\phi_M$ denotes the work function of the electrode, and $\chi_S$ denotes the electron affinity of the semiconductor (a difference in energy between the vacuum level and the bottom end of a conduction band. In addition, according to Physical Review Letters, 84(26), page 6080 (2000), the Schottky barrier $\Phi$ is given by Equation 2.

$$\Phi = \gamma_B(\phi_M - \chi_S) + (1-\gamma_B)E_g/2 \quad \text{Equation 2}$$

where, Equations 3 to 5 are as follows.

$$\gamma_B = 1 - e^2 d_{MS} N_B / \in_{it}(E_g + \kappa) \quad \text{Equation 3}$$

$$\kappa = 4e^2/(\in_S d_B) - 2e^2/(\in_{it} d_{MS}) \quad \text{Equation 4}$$

$$\in_{it} = 1/(1/(2\in_S) + 1/(2\in_M)) \quad \text{Equation 5}$$

where, $E_g$ denotes the band gap energy of the semiconductor, e denotes the elemental charge of the electron, $d_{MS}$ denotes a distance between atoms configuring the electrode and the semiconductor at the interface between the electrode and the semiconductor, $N_B$ denotes the number of bonds (bonding between atoms) per unit area at the interface between the electrode and the semiconductor, a denotes the number of closest atoms of configuration atoms in the interface direction of the interface between the electrode and the semiconductor, $\in_S$ denotes a relative dielectric constant of the semiconductor, $d_B$ denotes a distance between the configuration atoms in the interface direction of the interface between the electrode and the semiconductor, and $\in_M$ denotes a relative dielectric constant of the electrode. Since $\in_M$ is infinity if the electrode is metal, $$\in_{it} \sim 2\in_S \quad \text{Equation 6}$$

is used. If the electrode is not metal, Equation 5 may be used.

However, in the discussion of Physical Review Letters, 84, (26), page 6080 (2000), bonding between atoms at the interface is applied only to the interface between the electrode and the inorganic semiconductor of a chemical bond. In general, since the bond is relatively weak, it can not be applied to the interface between the electrode and the inorganic semiconductor.

SUMMARY OF THE INVENTION

In the embodiments of the present invention, in an organic TFT, a method of determining a combination of an electrode and organic semiconductor, which is capable of improving the electron ejection efficiency and the hole injection efficiency is provided, and an organic complementary TFT (organic CTFT) array, which realizes an n-type channel TFT and a p-type channel TFT and forms an organic complementary thin film (organic CTFT) and a desired predetermined circuit using the organic CTFT, is provided. In addition, the organic complementary TFT (organic CTFT) can be realized even if the same organic semiconductor is used, and a method of manufacturing the organic complementary TFT (organic CTFT) array using an economical process is provided.

The n-type TFT and p-type TFT are realized by selectively changing only a cover coat without changing a TFT material, using the equation for providing the magnitude of a difference in Fermi energy between an interface between semiconductor and an electrode and an interface between semiconductor and an insulator. In this case, in order to configure a predetermined circuit, a source electrode and a drain electrode of the p-type TFT and a source electrode and a drain electrode of the n-type TFT are respectively connected, a process of selectively changing the surface of the electrode is performed, and then an unnecessary interconnection is cut by irradiating light (using a scanning laser exposure apparatus or the like).

According to the present invention, since an organic CTFT device using an organic TFT can be manufactured, it is possible to easily manufacture a large-area, light-weight and thin integrated circuit using the organic CTFT. The present invention is applicable to liquid crystal displays, organic EL displays, IC cards, and tags.

Other objects, features and advantages of the invention will become apparent from the following description of the embodiments of the invention taken in conjunction with the accompanying drawings.

DETAILED DESCRIPTION OF THE EMBODIMENTS

Embodiment 1

In the present embodiment, the discussion of Physical Review Letters, 84, (26), page 6080 (2000) is extended such that a method of deriving the Schottky barrier $\Phi$ from the physical constants of elements configuring the semiconductor and the electrode at the interface between the electrode and the organic semiconductor is derived. Examining the electron state of hydrogen terminated silicon surface-high-molecular polythiophene, gold-pentacene crystal, silver-pentacene crystal, gold-various types of thiol monomolecule film, or silver-various types of thiol monomolecule film, as a combination of the electrode and the organic semiconductor, by electron state measurement using a scanning tunneling microscopy and theoretical computation using first principle calculation, it turned out that the Schottky barrier $\Phi$ can be estimated using Equations 7 to 11.

That is, if the carrier is the electron, the Schottky barrier $\Phi$ is given by Equation 7.

$$\Phi = \gamma_B(\phi_M - \chi_S) + (1-\gamma_B)E_g/2 \quad \text{Equation 7}$$

where, Equations 8 to 10 are as follows.

$$\gamma_B = 1 - \alpha_{MS} e^2 d_{MS} N_B / \epsilon_{it}(E_g + \kappa) \quad \text{Equation 8}$$

$$\kappa = a\alpha_B e^2/(\epsilon_S d_B) - 2\alpha_{MS} e^2/(\epsilon_{it} d_{MS}) \quad \text{Equation 9}$$

$$\epsilon_{it} = 1/(1/(2\epsilon_S) + 1/(2\epsilon_M)) \quad \text{Equation 10}$$

In particular, if the electrode is metal, $$\epsilon_{it} \sim 2\epsilon_S \quad \text{Equation 11}$$

where, $\phi_M$ denotes the work function of the electrode, $\chi_s$ denotes the electron affinity of the organic semiconductor, $E_g$ denotes the band gap energy of the organic semiconductor, $\alpha_{MS}$ denotes the interaction correction coefficient between the electrode and the organic semiconductor, e denotes the elemental charge of the electron, $d_{MS}$ denotes a distance between atoms configuring the electrode and the organic semiconductor at the interface between the electrode and the organic semiconductor, $N_B$ denotes the number of bonds (bonding between atoms) per unit area at the interface between the electrode and the organic semiconductor, a denotes the number of closest atoms of an atom configuring the electrode in the interface direction at the interface between the electrode and the organic semiconductor, $\alpha_B$ denotes an interaction correction coefficient between the elements configuring the electrode in the interface direction of the interface between the electrode and the organic semiconductor, $\epsilon_S$ denotes the relative dielectric constant of the organic semiconductor, $d_B$ denotes a distance between the atoms configuring the electrode in the interface direction of the interface between the electrode and the organic semiconductor, $\epsilon_M$ denotes a relative dielectric constant of the electrode ($\epsilon_M$ to infinity if the electrode is metal). $\alpha_{MS}$ and $\alpha_B$ denote correction coefficients according to the type of the interaction for the interaction between the electrode and organic semiconductor and between the elements configuring the electrode, respectively. If a value of about $\alpha=1$ is used for the covalent bond or the ion bond of inorganic semiconductor or the metal bond, a value of $\alpha=0.7$ to 1 for the Van der Waals' force (force between molecules) having low interaction, and a value of $\alpha=0.4$ to 1 is used for the interaction in which charges are expected to be moved to some extent between such as silver and pentacene molecules, excellent estimated values of the Schottky barrier $\Phi$ are proved to be obtained.

Using this estimation method, as an example of realizing the n-type channel FET and the p-type channel FET by starting from one type of electrode and using one type of organic semiconductor, the followings are possible.

(1) Silver and silver oxide are used as the electrode, and pentacene crystal (single crystal or polycrystalline) is used as the organic semiconductor.

(2) Silver and silver sulfide (or thiol molecules obtained by bonding hydrogen carbide molecules to sulfur atoms) are used as the electrode, and pentacene crystal (single crystal or polycrystalline) is used as the organic semiconductor.

(3) Titanium and titanium oxide are used as the electrode, and pentacene crystal (single crystal or polycrystalline) is used as the organic semiconductor.

(4) Titanium carbide and titanium oxide are used as the electrode, and pentacene crystal (single crystal or polycrystalline) is used as the organic semiconductor.

Embodiment 2

In the present embodiment, an example of a basic cell of an organic CTFT array according to the present invention is disclosed.

Figure 1A:
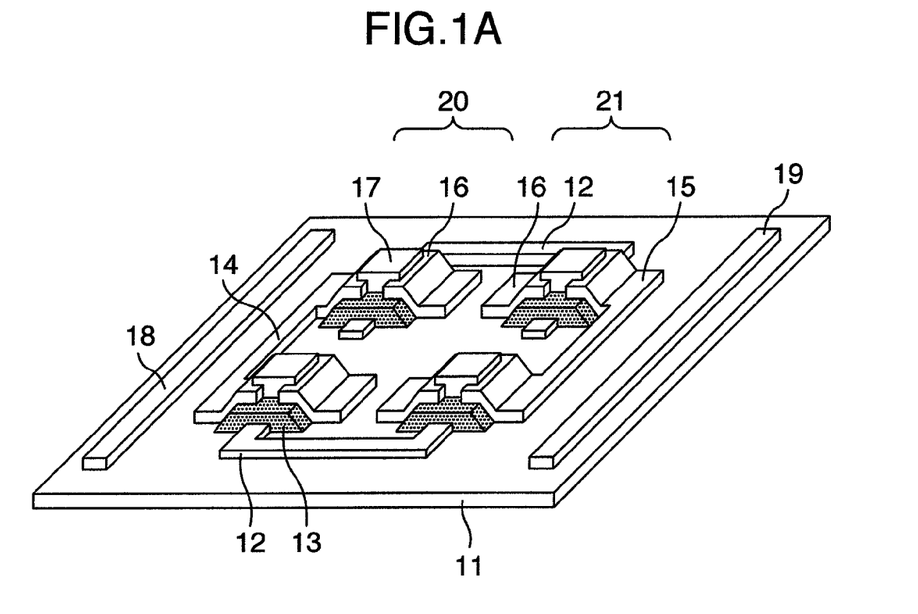
FIG. 1A is an air view showing an example of the structure of a basic cell formed by an embodiment of the present invention.
Figure 2A:
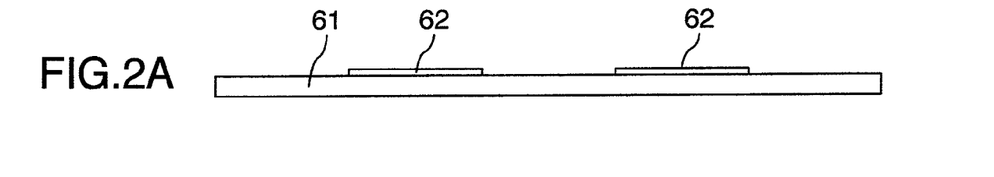
FIGS. 2A to 2F are cross-sectional views showing an example of a method of manufacturing an organic TFT according to an embodiment of the present invention.
Figure 2B:
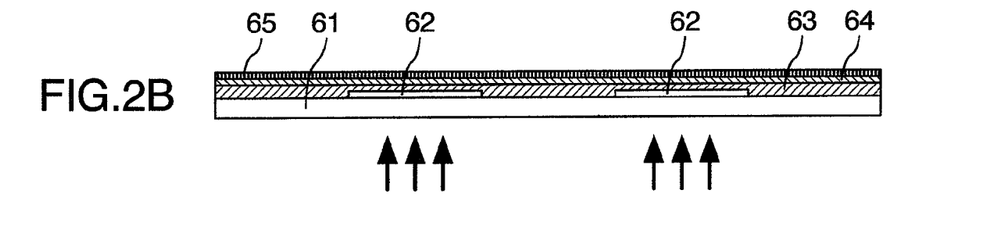

FIG. 1A is a schematic air view showing an example of the structure of a basic cell of an organic CTFT array according to the present invention. FIG. 2A is a view showing a circuit corresponding to FIG. 1A. In FIG. 1A, an organic semiconductor thin film 17 is a polycrystalline pentacene thin film formed of pentacene crystal particles in the present embodiment. A source electrode 14, a source electrode 15, the organic semiconductor thin film 17, a drain electrode 16 and a gate electrode 12, together with a gate insulator 13, configure the basic cell. If the organic CTFT is configured, the drain electrodes of one of n-type channel TFTs 20 and one of p-type channel TFTs 21 are connected, the source electrode 15 operates as a ground electrode, the source electrode 14 operates as an operation voltage applying electrode such that a voltage signal is input to the gate electrode 12, and the drain electrode 16 operates as an output electrode, thereby operating the organic CTFT. The basic cell shown in FIG. 1A may configure all logic gates necessary for configuring logic circuits such as a NAND, a NOR, an non-inverted buffer and so on by changing a method of connecting the electrodes, and may configure a desired circuit (in particular, a logic circuit) using an organic thin film transistor by interconnecting the basic cell array by a general process such as conductive ink printing or photolithography.

Figure 1B:
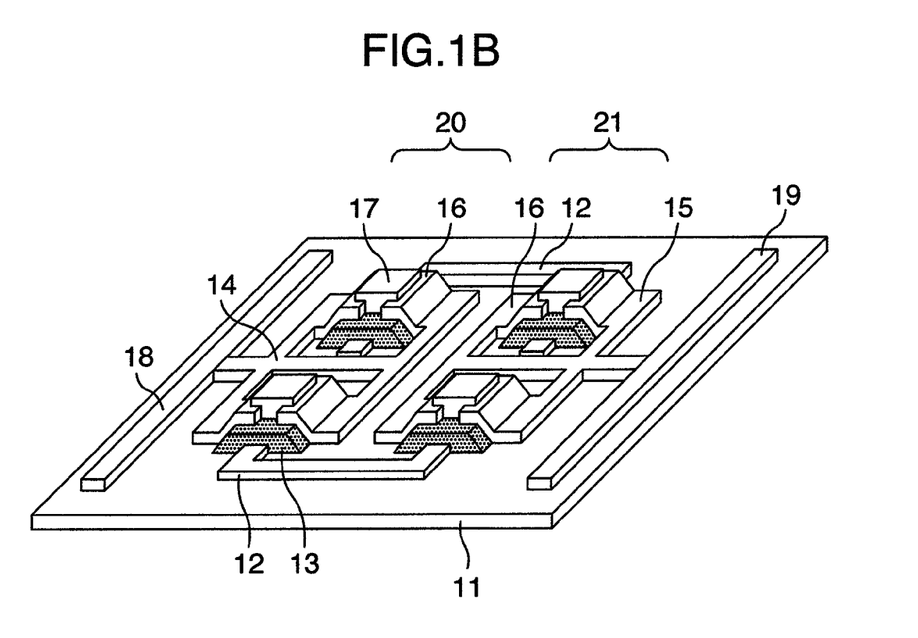
FIG. 1B is an air view showing an example of the structure of the basic cell in which electrodes are interconnected in order to perform a process of the basic cell shown in FIG. 1A.
Figure 1C:
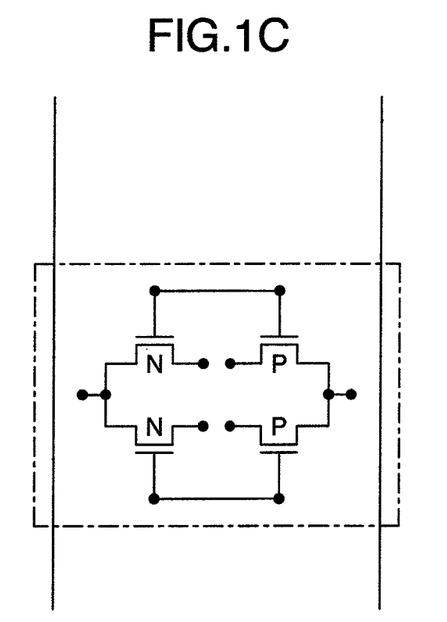
FIG. 1C is a circuit diagram corresponding to the basic cell shown in FIG. 1A.
Figure 1D:
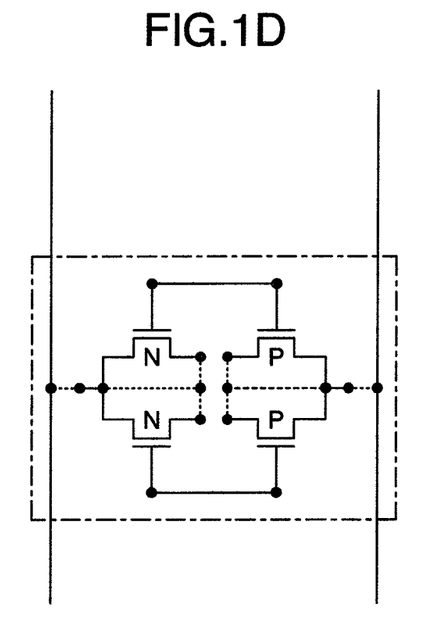
FIG. 1D is a circuit diagram corresponding to the basic cell shown in FIG. 1A.

In the present embodiment, with respect to the source electrodes and the drain electrodes of the n-type channel TFT 20 and the p-type channel TFT 21, the source electrodes and the drain electrodes are selectively oxidized starting from the same material (silver in the present embodiment) so as to form the n-type channel TFT 20 (silver oxide electrode) and the p-type channel TFT 21 (silver electrode). Accordingly, when the basic cell shown in FIG. 1A is formed, the source electrodes and the drain electrodes of the n-type channel TFT 20 and the p-type channel TFT 21 are connected such that a common voltage can be applied. FIG. 1B is an air view showing an example of the structure of the basic cell in which electrodes are interconnected in order to process the basic cell shown in FIG. 1A. FIG. 1D is a circuit diagram corresponding to the basic cell shown in FIG. 1B. As shown in FIG. 1B, an oxidation potential is applied to the source electrode and the drain electrode of the n-type channel TFT 20 by a power source voltage line 18 and a reduction potential is applied to the source electrode and the drain electrode of the p-type channel TFT 21 by a power source voltage line 19 such that the source electrodes and the drain electrodes can be selectively oxidized. Thereafter, an unnecessary interconnection portion of FIG. 1B is removed such that the basic cell shown in FIG. 1A is manufactured. As a method of removing the unnecessary interconnection portion, a general process such as photolithography may be used. Alternatively, the source electrode, the drain electrode, and all or one portion of the interconnections may be manufactured by an organic material which is deformed by irradiating strong light, such as bis(ethylenetio)tetrathiafulvalene (BET-TTF) or poly(ethylenedioxythiophene)/(poly(styrene sulfonate) (PEDOT/PSS), and the unnecessary interconnections may be cut by irradiating light using a scan type laser exposure apparatus.

Embodiment 3

In the present embodiment, an example of a method of manufacturing the organic TFT formed by the present invention is disclosed. FIGS. 2A to 2F are cross-sectional views showing an example of the method of manufacturing the organic TFT according to the present invention. In the present embodiment, a material having plasticity is used and the method of configuring the organic TFT of the present invention by a printing method or a coating method without using lithography will be described. FIGS. 2A to 2F are views illustrating the manufacturing method in detail.

As shown in FIG. 2A, a gate electrode 62 is printed on a plastic substrate 61 using conductive ink. The gate electrode 62 is formed by firing. However, a softening temperature should be careful because plastic is used in the substrate. In the present embodiment, a high-heat-resistance high-transparency polyimide sheet having a thickness 100 μm is used in the substrate 61 and a firing temperature can be increased up to about 250° C. Accordingly, an aqueous silver ultrafine particle dispersion solution used in the conductive ink can sufficiently endure a necessary firing temperature of 120° C.

Polymethylmethacrylate (PMMA) is spin-coated on the substrate 61 and the gate electrode 62 and is sufficiently dried, thereby forming a gate insulating film 63. Here, a dry process is performed using a hot plate at 100° C. for 10 minutes. A photosensitive thin film 64 is formed. In the present embodiment, positive resist is spin-coated so as to obtain a film having a thickness of 100 nm.

Figure 2C:
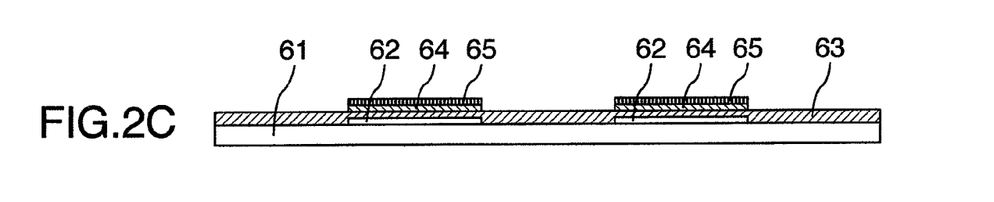
Figure 2D:
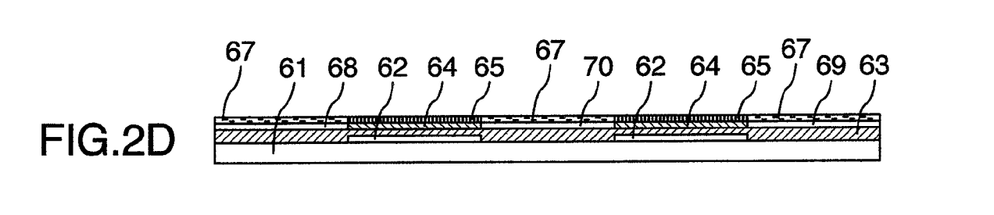
Figure 2E:
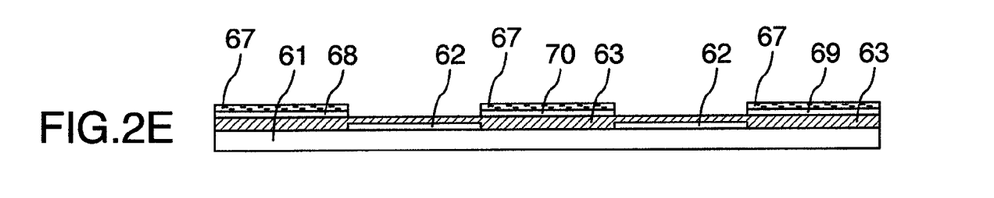
Figure 2F:
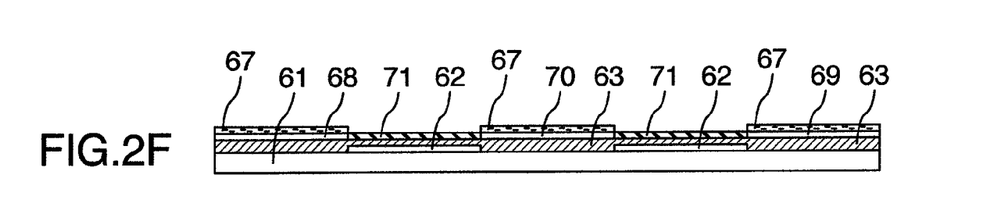

Next, a liquid repellent pattern is formed in order to form a source electrode 68, a source electrode 69 and a drain electrode 70. Optool (trademark) formed of fluoroalkyl-based silane coupling agent (Daikin Industries, Ltd.,) diluted by perfluorooctane up to 0.1 wt % is spin-coated as a liquid repellent film 65 and a ultraviolet ray is irradiated to the surface of the plastic substrate 61 by a mercury lamp as indicated by arrows in the cross-sectional view of FIG. 2B. Since the ultraviolet ray necessary for exposing the photosensitive thin film 64 used in the present embodiment is an i-ray having a wavelength of 365 nm, in order to avoid the damage of the laminated gate insulating film 63 (high-molecular polymer film and polymethylmethacrylate (PMMA) film), it is preferable that a ultraviolet ray having a wavelength of 300 nm or less is cut by a filter and is irradiated. Since a metal electrode is already formed in the gate electrode 62, the irradiated ultraviolet ray can not pass through an area in which an organic semiconductor thin film 71 is formed, and the photosensitive thin film is exposed only in areas corresponding to the source electrode 68, the source electrode 69 and the drain electrode 70. After the ultraviolet ray is irradiated for 30 seconds, the photosensitive thin film is developed such that the photosensitive thin film 64 in the areas corresponding to the source electrode 68, the source electrode 69 and the drain electrode 70 is removed and the liquid repellent film 65 in that area is lifted off. The liquid repellent film 65 is formed in the area in which the organic semiconductor thin film 71 is formed (FIG. 2C). The source electrode 68, the source electrode 69, and the drain electrode 70 are formed using the conductive ink, similarly to the gate electrode 62 (FIG. 2D). In this step, as described in Embodiment 2, the source electrode 68 is selectively oxidized so as to form the source electrode 68 (silver oxide electrode) and the source electrode 69 (silver electrode). Similarly, a fluoroalkyl-based silane coupling agent is spin-coated so as to form a liquid repellent film 67 (FIG. 2D). The photosensitive thin film 64 is removed using a solvent of the photosensitive thin film 64 such that the liquid repellent film 65 is lifted off and, as shown in FIG. 2E, only the area excluding the area in which the organic semiconductor thin film 71 is formed, that is, areas 67 corresponding to the source electrode 68, the source electrode 69 and the drain electrode 70 exhibit the liquid repellent property. In the present embodiment, acetone is used as a photosensitive thin film solvent.

Next, in order to form a channel, the organic semiconductor thin film 71 is coated. Using a discharge apparatus including a nozzle position control mechanism, a solution discharge rate control mechanism and a solution heating mechanism, a solution of the organic semiconductor thin film is supplied to the channel in a nitrogen atmosphere. In the present embodiment, as described in Synthetic Metals, Vol. 135, page 1 (2005), 0.1-wt % pentacene is dispersed in a solvent using trichlorobenzene, is heated at 200° C. to be dissolved, and is used as a solution. This solution is supplied via the nozzle by 3 microliters. In order to prevent crystal growth in the solution due to the rapid decrease of the temperature of the solution, the substrate is heated at about 170° C. The supplied solution is dried such that the organic semiconductor thin film 71 is formed as shown at an upper side of FIG. 2F. The organic semiconductor thin film 71 is formed in a hydrophilic area and a CMOS transistor having plasticity is formed by a low-cost method such as the printing/coating method without using lithography.

Although, in the present embodiment, polyimide is used in the substrate and PMMA is used in the insulating film, various types of plastic substrates having plasticity starting from polyphenylvinyl may be used in the substrate and polyimide, polyphenylvinyl or the like may be used in the insulating film. If plasticity is not required, an inorganic insulating film is used in the substrate so that the selectivity of the manufacturing process such as printing/coating is increased. After the gate electrode is formed, the insulating film is formed by spin-on-glass (SOG), positive resist is spin-coated and the ultraviolet ray is irradiated to the rear surface using the mercury lamp. Since the resist excluding an area shielded by the gate electrode is dissolved and removed by the development, the resist pattern is equal to the pattern of the gate electrode. In this state, the fluoroalkyl-based silane coupling agent is spin-coated. Subsequently, the resist is removed using acetone such that the fluoroalkyl-based silane coupling agent is lifted off, thereby obtaining a desired liquid repellent pattern. This method can not be used when organic materials are used in the components other than the substrate because a heat treatment of about 450° C. is required for firing of SOG and the organic solvent is used for removing the resist. This method is advantageous in that the number of manufacturing processes is reduced or metal is not required for forming the liquid repellent film.

Embodiment 4

Figure 3:
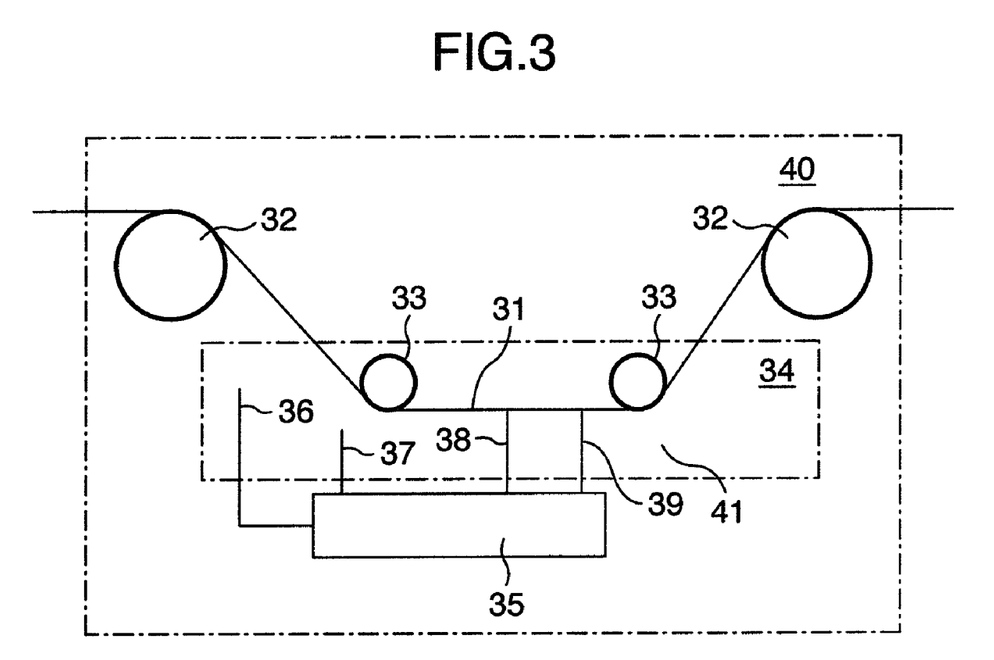
FIG. 3 is a schematic view showing a portion of a manufacturing apparatus for realizing consecutive surface treatment of an electrode for an organic complementary thin film transistor according to an embodiment of the present invention.

In the present embodiment, an example of a portion of a manufacturing apparatus for realizing consecutive surface treatment of an electrode for an organic TFT according to the present invention will be disclosed. FIG. 3 is a schematic view showing the portion of the manufacturing apparatus for realizing consecutive surface treatment of an electrode for the organic TFT according to the present invention. A chamber 40 is filled with dried nitrogen for maintaining the atmosphere of the apparatus, but this may not be necessary according to the characteristics of the used organic semiconductor or electrode material. The source electrode and the drain electrode for the n-type channel TFT and the p-type channel TFT are formed on the substrate 31 and a flexible substrate having plasticity is used. The substrate 31 is transmitted when substrate guide rollers 32 and 33 (outlet side) are rotated and is output when the substrate guide rollers 32 and 33 (inlet side) are rotated. Before and after the chamber 40, the manufacturing apparatus other than the surface treatment of the electrodes may be consecutively mounted. The substrate 31 is guided by the substrate guide roller 33 in a solution vessel 34 and is immersed in an oxidation/reduction solution 41. At this time, the electrodes for the n-type channel TFT and the p-type channel TFT are subjected to the surface treatment by a potentiostat 35. The potentiostat 35 has a reference electrode 36, an operation electrode 37, an oxidation/reduction electrode 38, and an oxidation/reduction electrode 39. The reference electrode 36 inputs a potential (reference potential) of the oxidation/reduction solution 41 to the potentiostat 35. The potentiostat 35 controls the potentials of the operation electrode 37, the oxidation/reduction electrode 38 and the oxidation/reduction electrode 39 on the basis of the reference potential.

At this time, the current flowing in the oxidation/reduction electrode 38 and the oxidation/reduction electrode 39 is controlled and a circuit is configured such that current flows in the operation electrode 37 as a counter electrode and current does not flow in the reference electrode 36. In the present embodiment, the oxidation/reduction electrode 38 is maintained at an oxidation potential and is used for oxidizing the surface of the electrode for the n-type channel TFT. In contrast, the oxidation/reduction electrode 39 is maintained at a reduction potential such that the surface of the silver electrode which is the electrode for the p-type channel TFT is not oxidized. The surfaces of the electrode for the n-type channel TFT and the p-type channel TFT are treated under a managed environment and the substrate 31 is consecutively transferred such that a product having stable performance can be realized with low cost.

As the surface treatment of the electrode for the organic TFT, an electrode to which a thin film with a thickness of 0.3 to 1 molecular layer containing pentafluorobenzenethiol, perfluoroalkylthiol, trifluoromethanethiol, pentafluoroethanethiol, heptafluoropropanethiol, nonafluorobutanethiol, sodium butanethiol, sodium butanoate thiol, sodium butanol thiol or aminothiophenol is adsorbed, and an electrode covered with a thin film with a thickness of 0.3 to 5 atom layer containing sulfur, oxygen, halogen element, calcium, magnesium, or a compound of these elements and the electrode element, are effective examples.

Figure 4:
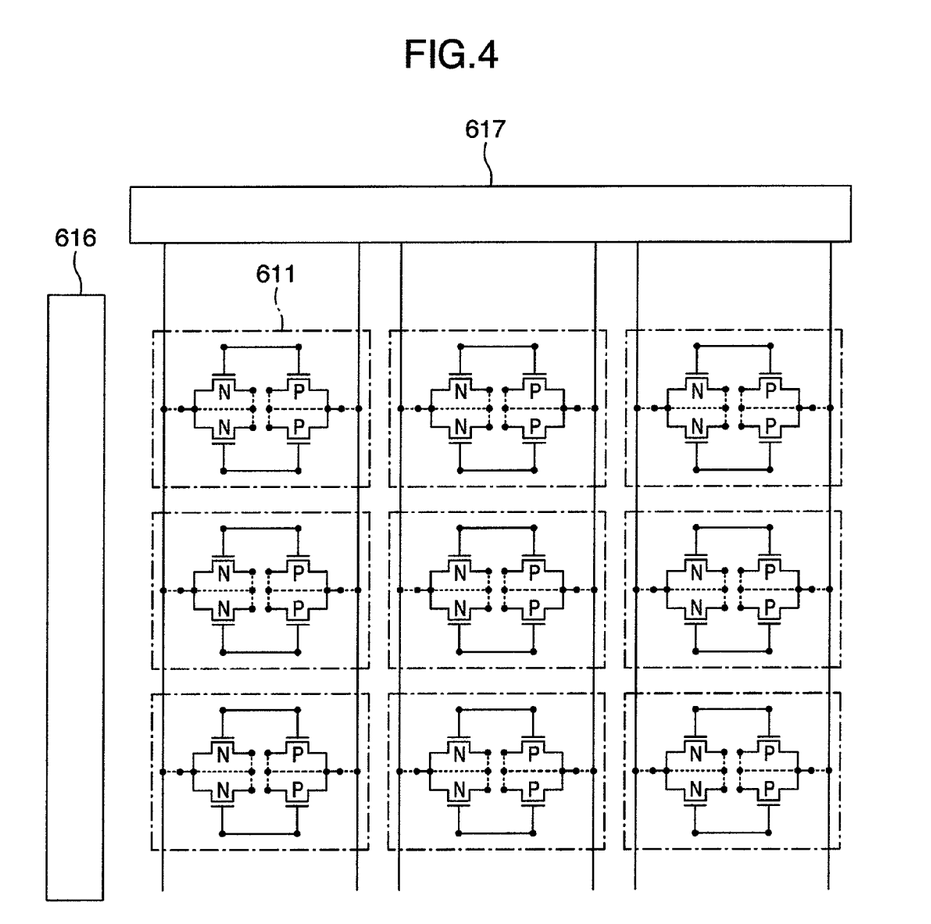
FIG. 4 is a circuit diagram showing an example of an organic complementary thin film transistor array according to an embodiment of the present invention.
Figure 5:
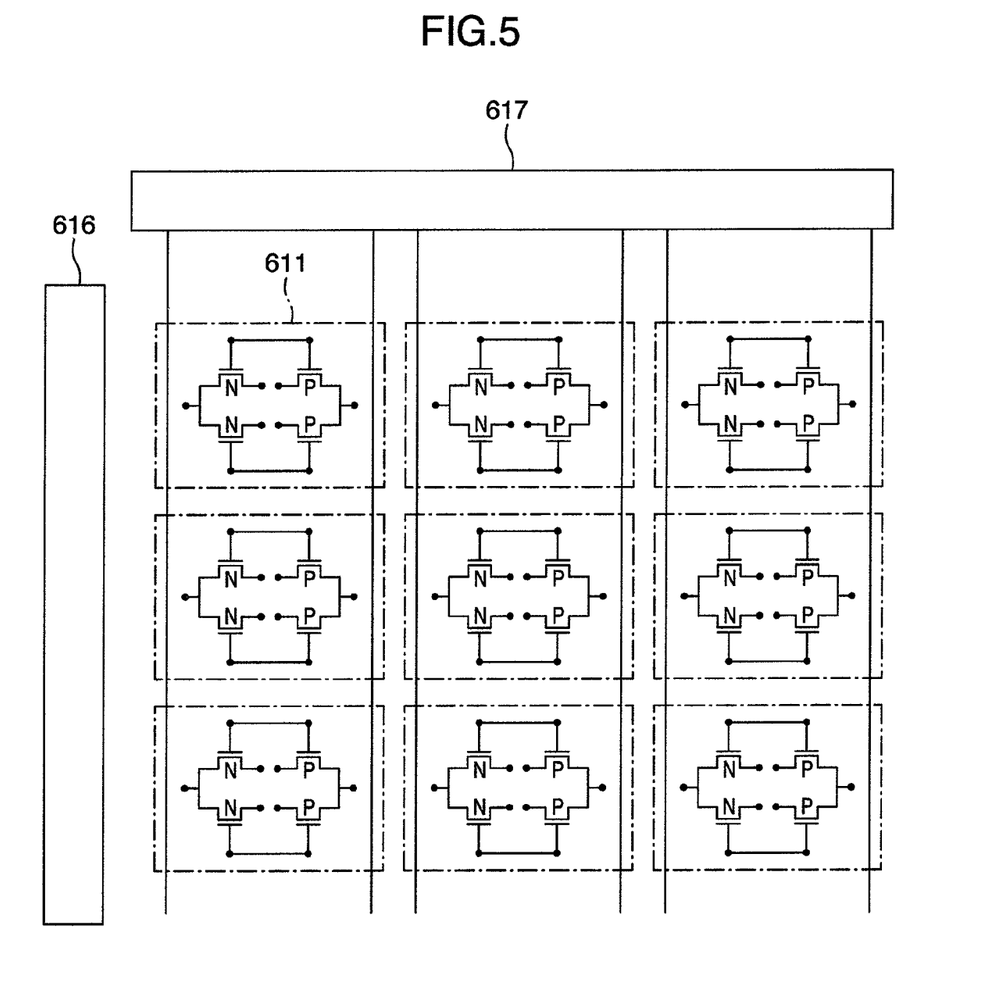
FIG. 5 is a circuit diagram showing an example of a process of an organic complementary thin film transistor array according to an embodiment of the present invention.
Figure 6:
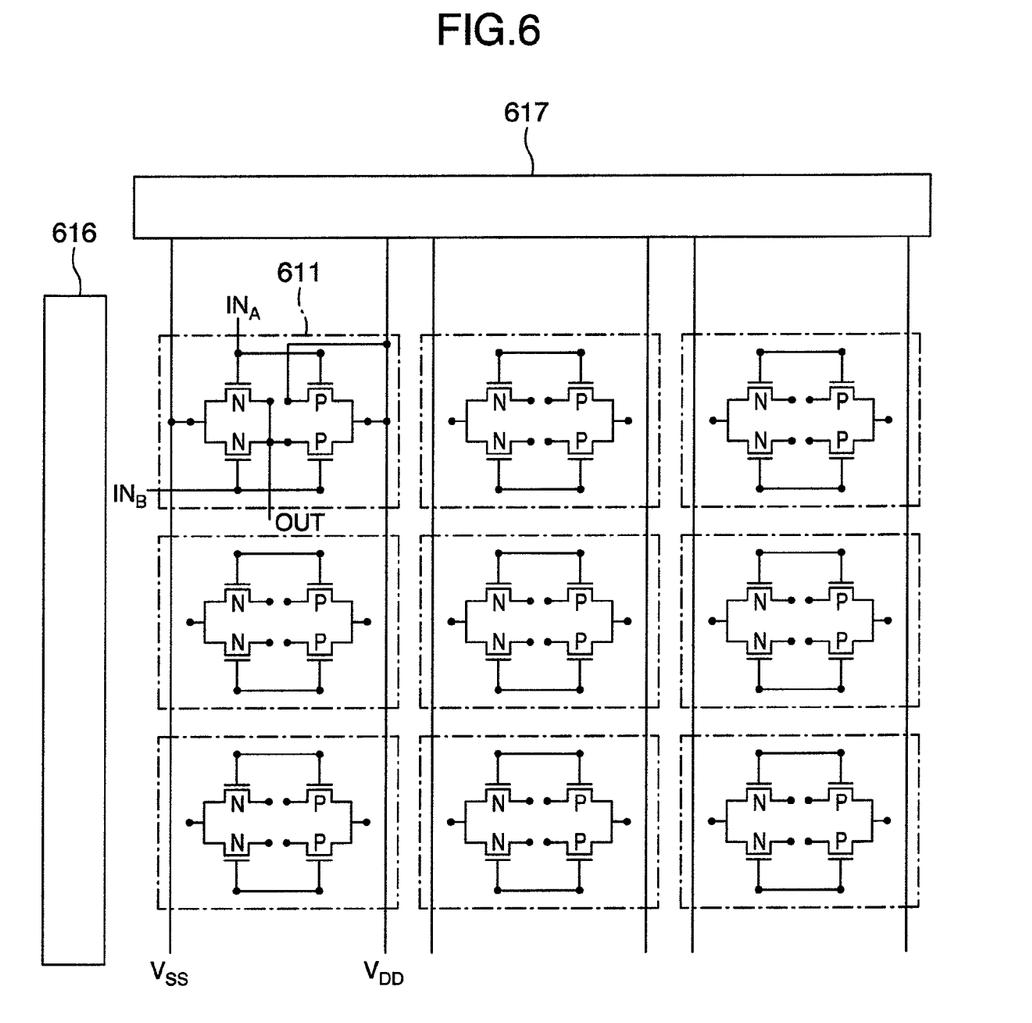
FIG. 6 is a circuit diagram showing an example of a process of an organic complementary thin film transistor array according to an embodiment of the present invention.

FIGS. 4, 5 and 6 are circuit diagrams showing a process of manufacturing an organic CTFT array using the basic cell according to the present invention. In FIG. 4, the source electrodes and the drain electrodes of the n-type channel TFT and the p-type channel TFT are connected in a basic cell 611. In this step, the surface treatment of the electrode for the organic TFT is performed and the electrode for the n-type channel TFT and the p-type channel TFT is formed. In FIG. 5, an unnecessary interconnection is removed in the basic cell 611. FIG. 6 shows, for example, a circuit diagram of a NOR circuit in the basic cell 611. The necessary interconnection can be performed by a general process such as conductive ink printing or photolithography. Here, $IN_A$, $IN_B$, OUT, $V_{SS}$, and $V_{DD}$ are an A input, a B input, an output, a power supply voltage SS and a power supply voltage DD, respectively. With respect to all the basic cells requiring the same interconnection, a desired predetermined (logic) circuit can be formed.

It should be further understood by those skilled in the art that although the foregoing description has been made on embodiments of the invention, the invention is not limited thereto and various changes and modifications may be made without departing from the spirit of the invention and the scope of the appended claims.

The invention claimed is:

1. An organic thin film transistor array configured by a plurality of basic cells, each comprising at least two sets of organic complementary thin film transistors (organic CTFT) as basic cells, each of which has an n-type channel FET and a p-type channel FET, both of which have a common gate electrode, the basic cell comprising:
   a plurality of source electrodes, at least one drain electrode, and an organic semiconductor thin film, wherein at least one of the electrodes is formed of metal oxide, a reduced metal oxide, an organic conductive material and an organic conductive material the surface of which is modified by another material.

2. The organic thin film transistor array according to claim 1, wherein an organic complementary thin film transistor (organic CTFT) is configured by said plurality of source electrodes and said drain electrode.

3. An organic thin film transistor array of basic cells, each comprising at least two sets of organic complementary thin film transistors (organic CTFT), each of which has an n-type channel FET and a p-type channel FET, both of which have a common gate electrode, wherein a source electrode and a drain electrode include a first metal and have a structure in which the surfaces of said electrodes are covered with a thin film with a thickness of 0.3 to 5 atom layer containing a compound of a second element and said first metal.

4. The organic thin film transistor array according to claim 3, wherein:

first and second source electrodes, at least one drain electrode and an organic semiconductor thin film are included and said first source electrode is formed of any one of gold, silver, copper or titanium, and said second source electrode is formed of any one of gold, silver, copper or titanium and the surface of said second source electrode is covered with a thin film with a thickness of 0.3 to 5 atom layer containing sulfur, oxygen, halogen element, calcium, magnesium, or a compound of these elements and the electrode elements.

5. The organic thin film transistor array according to claim 3, wherein:

first and second source electrodes, at least one drain electrode, an organic semiconductor thin film are included and said first source electrode is formed of any one of gold, silver, copper or titanium, and, on the surface of said second electrode, a thin film with a thickness of 0.3 to 1 molecular layer containing pentafluorobenzenethiol, perfluoroalkylthiol, trifluoromethanethiol, pentafluoroethanethiol, heptafluoropropanethiol, nonafluorobutanethiol, sodium butanethiol, sodium butanoate thiol, sodium butanol thiol or aminothiophenol is provided.

6. A method of manufacturing an organic thin film transistor array of basic cells, each comprising at least two sets of organic complementary thin film transistors (organic CTFT), each of which has an n-type channel FET and a p-type channel FET, both of which have a common gate electrode, comprising:

a first step of forming first and second source electrodes, at least one drain electrode, and an organic semiconductor thin film on a substrate as the basic cell, and oxidizing or reducing at least one of the electrodes by an electrochemical solution reaction or a vapor reaction, wherein during said first step, an interconnection is formed between at least two of the electrodes; and a second step of removing a portion of the interconnection formed in said first step.

7. The method according to claim 6, further comprising absorbing a material different from an electrode material and removing a portion of said electrode material on the surface of at least one of said electrodes.

8. The method according to claim 6, wherein said substrate having said electrodes consecutively pass through a solution or vapor such that a material different from said electrode material is absorbed and a portion of said electrode material is removed from the surface of at least one of said electrodes.

* * * * *